United States Patent [19]

Sato et al.

[11] Patent Number: 5,602,798
[45] Date of Patent: Feb. 11, 1997

[54] SYNCHRONOUS SEMICONDUCTOR MEMORY DEVICE OPERABLE IN A SNOOZE MODE

[75] Inventors: Hirotoshi Sato; Shigeki Ohbayashi, both of Tokyo, Japan

[73] Assignee: Mitsubishi Denki Kabushiki Kaisha, Tokyo, Japan

[21] Appl. No.: 505,021

[22] Filed: Jul. 21, 1995

[51] Int. Cl.$^6$ ....................................... G11C 7/00
[52] U.S. Cl. ......................... 365/233; 365/194; 365/195; 365/196
[58] Field of Search ........................ 365/230.01, 189.01, 365/233, 194, 195, 196

[56] References Cited

U.S. PATENT DOCUMENTS 5,490,116  2/1996  Tobita et al. ............................. 365/226

*Primary Examiner*—Viet Q. Nguyen
*Attorney, Agent, or Firm*—Lowe, Price, LeBlanc & Becker

[57] ABSTRACT

A synchronous semiconductor memory device includes a clock input circuit receiving an externally applied clock signal to produce an internal clock signal, a signal input circuit taking in an externally applied signal to produce an internal signal, a first delay circuit delaying an externally applied snooze mode signal by a first delay time for supplying to a clock input circuit, and a second delay circuit delaying the externally applied snooze mode signal by a second delay time for supplying to the signal input circuit. The clock input circuit and the signal input circuit are disabled when the internal snooze mode signal is active. The semiconductor memory device takes in the external signal and produces an internal signal in synchronization with the internal clock signal. Upon switching over to the snooze mode, the operation is performed in accordance with the external signal in the cycle in which the snooze mode is designated, and the internal operation is inhibited in the subsequent cycles. Upon release from the snooze mode, the internal clock signal is produced in the cycle subsequent to the cycle in which the release from the snooze mode is designated, and the signal input circuit is enable in and after the clock cycles subsequent to the cycle in which the internal clock signal is produced.

10 Claims, 8 Drawing Sheets

SYNCHRONOUS SEMICONDUCTOR MEMORY DEVICE OPERABLE IN A SNOOZE MODE

BACKGROUND OF THE INVENTION

1. Field of the Invention

The present invention relates to a synchronous semiconductor memory device which operates in synchronization with an externally applied clock signal having a predetermined cycle, and in particular to a structure of a signal input portion of the synchronous semiconductor memory device operable in a low power consumption mode.

2. Description of the Background Art

A microprocessor internally has a cache memory of a small storage capacity. In order to improve a system performance by reducing a wait time of the microprocessor at the time of cache miss, such a structure may be employed that the microprocessor is externally provided with a memory having a relatively large storage capacity, which is used as a secondary cache. The memory used as the secondary cache operates in synchronization with an external clock signal such as a system clock. Since it is not necessary to take a margin with respect to skew of a signal into consideration, and a deciding timing of input/output data is determined by the clock signal, fast input and output of data are allowed, and cache miss penalty can be suppressed.

FIG. 1 schematically shows a whole structure of a conventional synchronous semiconductor memory device operating in synchronization with a clock signal. The synchronous semiconductor memory device shown in FIG. 1 includes an SRAM (Static Random Access Memory) array 1 having a storage capacity of 32k.32-bits. One word consists of 32 bits. SRAM cells included in array 1 have the same structure as memory cells included in a conventional SRAM, and are formed of flip-flops.

The synchronous semiconductor memory device further includes input circuits 2a–2r which receive externally applied signals and produce internal signals. Input circuit 2a receives an externally applied address signal. Input circuit 2b receives a burst mode control signal MODE which determines a mode of changing the addresses in a burst mode as will be described later. In the burst mode, when one address is designated, data of memory cells at four addresses are continuously read or written.

Input circuit 2c receives a snooze mode signal /ZZ. In the snooze mode, the semiconductor memory device stops its operation, so that the power consumption of the semiconductor memory device is minimized.

Input circuit 2d receives a burst mode advance signal /ADV. When burst mode advance signal /ADV is active, address signals are automatically generated in the semiconductor memory device.

Input circuit 2e receives an externally applied clock signal CLK. Internal clock signal CLK produced by input circuit 2e determines the timing of taking in the external signals and the timing of inputting and outputting data. At the time of rising of internal clock signal CLK, the externally applied address signal is taken in, and valid input/output data is written/read.

Input circuits 2f and 2g receive address status signals /ADSC and /ADSP, respectively. Address status signal /ADSC is supplied from a controller which controls transference of data between the semiconductor memory device used as the secondary cache and a main memory used as the main storage. Signal /ADSP is supplied from a processor using the above semiconductor memory device as the secondary cache. Input circuits 2h–2k receive byte write enable signals /BW1–/BW4. Byte write enable signals /BW1–/BW4 designate enabling of data writing for each byte of one word of 32 bits (4 bytes).

Input circuit 2l receives a main byte write enable signal /MBW which allows writing of data in a unit of byte. When main byte write enable signal /MBW is active, writing of data of a word can be performed in a unit of byte.

Input circuit 2m receives a global write enable signal /GW which enables writing of data for all bytes of one word.

Input circuits 2n–2p receive chip select signals /S1, S2 and /S2, respectively. Chip select signal /S1 is supplied from the processor, and chip select signals S2 and /S2 are supplied from the controller.

Input circuit 2q receives an output enable signal /OE designating a data reading operation. Input circuit 2r receives a flow through mode signal /FT designating a data outputting mode. Flow through signal /FT determines whether the output data is to be output via a register or via the register which is set to the through state.

Internal snooze mode signal /ZZ (in the following description, the internal and external signals are denoted by the same reference characters) sent from input circuit 2c is supplied to all the other input circuits 2a, 2b and 2d–2r. When internal snooze mode signal /ZZ is at the low level of active state, all the internal signals sent via input circuits 2a, 2b and 2d–2r are inactive.

The synchronous semiconductor memory device further includes an internal control signal generating circuit 3 which produces internal control signals in response to the internal signals sent from input circuits 2d–2p and internal clock signal CLK sent from input circuit 2e. The output signals of internal control signal generating circuit 3 are decided in response to rising of internal clock signal CLK. Internal control signal generating circuit 3 includes a gate circuit 3a receiving burst mode advance signal /ADV from input circuit 2d and internal clock signal CLK sent from input circuit 2e. Gate circuit 3a outputs a signal at the high level when internal burst mode advance signal /ADV is at the low level and the internal clock signal CLK is at the high level.

Internal control signal generating circuit 3 further includes an OR circuit 3b which receives internal byte enable signal /BW1 from input circuit 2h and internal main byte enable signal /MBW from input circuit 2l, an OR circuit 3c which receives internal byte enable signal /BW2 from input circuit 2i and internal main byte enable signal /MBW, an OR circuit 3d which receives internal byte enable signal /BW3 from input circuit 2j and internal main byte enable signal /MBW, an OR circuit 3e which receives internal byte enable signal /BW4 from input circuit 2k and internal main byte enable signal /MBW, an AND circuit 3f which receives an output signal of OR circuit 3b and internal global write enable signal /GW from input circuit 2m, an AND circuit 3g which receives an output signal of OR circuit 3c and internal global write enable signal /GW, an AND circuit 3h which receives an output signal of OR circuit 3d and internal global write enable signal /GW, an AND circuit 3i which receives an output signal of OR circuit 3e and internal global write enable signal /GW, an NOR circuit 3j which receives internal address status signal /ADSP from input circuit 2g and internal chip select signal /S1 from input circuit 2n, a gate circuit 3k which receives internal address status signal /ADSC from internal circuit 2f and an output signal of NOR circuit 3j, and an AND circuit 31 which receives an output signal of gate circuit 3k and the internal clock signal from input circuit 2e. Gate circuit 3a supplies the burst advance instructing signal to a burst counter 7 which will be described later. An output signal ADSN from AND circuit 3i defines a latch (strobe) timing for the address in this semiconductor memory device, and instructs burst counter 7 to take in least significant two bits A0 and A1 of the latched address.

Internal control signal generating circuit 3 further includes an OR circuit 3m receiving output signals of gate circuit 3j and AND circuit 3f, an OR circuit 3n receiving output signals of gate circuit 3j and AND circuit 3g, an OR circuit 3o receiving output signals of gate circuit 3j and AND circuit 3h, an OR circuit 3p receiving output signals of gate circuit 3j and AND circuit 3i, and a gate circuit 3q receiving internal chip select signals /S1, S2 and /S2 from input circuits 2n, 2o and 2p, respectively. Gate circuit 3q outputs a chip select signal which is active when both internal chip select signals /S1 and /S2 are at the low level and internal chip select signal S2 is at the high level.

OR circuits 3m–3p output the signals which instruct writing of data for corresponding bytes of a 4-byte word. Writing of data of the respective bytes is instructed when internal clock signal CLK is at the high level and respective output signals of OR circuits 3m–3p are at the low level.

The semiconductor memory device further includes an address register 4 which takes in and latches the address signal from input circuit 2a when address strobe (status) signal ADSN from internal control signal generating circuit 3 is active, write registers 5a–5d which take in and latch inverted signals of the output signals of OR circuits 3m–3p included in internal control signal generating circuit 3 in response to rising of internal clock signal CLK, and a chip select register 6 which takes in and latches an internal chip select signal CS in response to activation of address strobe (status) signal ADSN. Write registers 5a–5d output the signals which instruct writing of respective bytes of the 4-byte word. Chip select register 6 outputs the signal CS which enables write/read of data from/to memory cell array 1 of the semiconductor memory device.

Burst counter 7 takes in and outputs address signals A0 and A1 at least significant two bits from address register 4 when address status (strobe) signal ADSN from internal control signal generating circuit 3 is active. Upon each rising of the output signal of gate circuit 3a included in internal control signal generating circuit 3, burst counter 7 changes the taken address signals and outputs the burst address signals A1' and A0'. The manner in which burst counter 7 changes address signals A0 and A1 at the least significant two bits is determined by internal mode designating signal MODE from input circuit 2b. Address signals A0 and A1 may be changed in a linear mode in which the value successively changes by one, or in an interleaved mode in which the value changes in a predetermined order, e.g., of 0-2-1-3. The address signals from address register 4 and address signals A1' and A0 from burst counter 7 are supplied in parallel to row and column decoders which are provided to memory cell array 1.

The semiconductor memory device further includes a write/read control circuit 9 which supplies signals controlling write/read of data in accordance with the output signals of write registers 5a–5d, the output signal of chip select register 6 and internal output enable signal /OE from input circuit 2q, an input/output buffer 10 coupled to data input/output terminals, an input register 11 which takes in and latches write data from input/output buffer 10 in accordance with internal clock signal CLK and the output signal of internal write/read circuit 9, write drivers 12a–12d which write internal write data into selected memory cells in the memory cell array in accordance with the write instructing signal from internal write/read control circuit 9, and an output register 13 which transmits data of the selected memory cells in memory cell array 1 to input/output buffer 10 in accordance with the read instructing signal from internal write/read control circuit 9. Output register 13 operates in accordance with internal flow through signal /FT which is supplied from input circuit 2r, and determines enable/disable of register circuits of output register 13. When internal flow through signal /FT is active, output register 13 holds data for one clock cycle before transmitting the data to input/output buffer 10. When flow through signal /FT is in the inactive state of high level, output register 13 is set to the through state, and immediately transmits the data of a selected memory cell transmitted from memory cell array 1 as received. Internal snooze mode signal /ZZ is also supplied from input circuit 2c to input/output buffer 10.

Internal write/read control circuit 9 includes an AND circuit 9a which receives the output signal of write register 5a and output signal CS of chip select register 5, an AND circuit 9b which receives the output signal of write register 5b and chip select signal CS from chip select register 6, an AND circuit 9c which receives the output signal of write register 5c and chip select signal CS from chip select register 6, an AND circuit 9d which receives the output signal of write register 5d and chip select signal CS from chip select register 6, an OR circuit 9e which receives the output signals of write registers 5a–5d, a gate circuit 9f which receives the chip select signal from chip select register 6 and internal output enable signal /OE from input circuit 2q, and a gate circuit 9g which receives the output signals of OR circuit 9e and gate circuit 9f. The output signals of AND circuits 9a–9d are supplied to write drivers 12a–12d as internal write instructing signals, respectively.

Gate circuit 9f outputs a signal at the high level when chip select signal CS from chip select register 6 is at the high level of the active state and internal output enable signal /OE from input circuit 2q is at the low level. Gate circuit 9g outputs a signal at the high level when the output signal of OR circuit 9e is at the low level and the output signal of gate circuit 9f is at the high level. Therefore, gate circuit 9f outputs a signal at the high level when the semiconductor memory device is set to the selected state and the data output (read) is designated. Gate circuit 9g outputs a signal at the high level when all the data write instructing signals are inactive and the data read or output is designated.

Output register 13 transmits the selected memory cell data from memory cell array 1 to input/output buffer 10 in synchronization with internal clock signal CLK, when the output signal of gate circuit 9g is at the high level. Input register 11 includes register circuits, which are provided corresponding to respective AND circuits 9a–9d, and are activated when AND circuits 9a–9d supply the signals at the high level, respectively. Further, input register 11 takes in the write data from input/output buffer 10 in response to rising of the internal clock signal, and transmits the write data to write drivers 12a–12d corresponding to the activated write instructing signals. Now, operation will be described below with reference to timing charts of FIGS. 2 and 3.

Referring first to FIG. 2, data read operation in the burst mode will be described. At clock cycle 0, address status (strobe) signal /ADSP is set to the low level, and chip select signal /S1 is set to the low level. Also, initial address AD0 is supplied from the processor at cycle 0 (T1 cycle). At clock cycle 1, address status signal ADSN from internal signal generating circuit 3 is set to the high level in response to rising of clock signal CLK, and address register 4 takes in and latches the address signal (initial address AD0) from input circuit 2a. In response to rising of internal address status signal ADSN, burst counter 7 takes in 2-bit address signals A0 and A1 from address register 4 as the initial burst address signals and outputs the same. When data is to be output, all signals /BW1–/BW4, /MBW and /GW for controlling the writing are at the high level, and the write enable signals at the low level are latched into write registers 5a–5d in response to rising of clock signal CLK. Meanwhile, the output signal of gate circuit 3q is set to the high level (signals S2 and /S2 are set to the high and low levels, respectively), the internal chip select signal is set to the high level, and chip select register 6 stores this chip select signal CS at the high level in response to rising of internal address status signal ADSN. In the semiconductor memory device, memory cells in memory cell array 1 are selected in accordance with the address signals sent from address register 4, and the burst counter 7 and data of the selected memory cells are transmitted to output register 13. When flow through signal /FT is at the low level indicating the flow through mode, output register 13 does not hold the data even if internal clock signal CLK is applied thereto, and transmits the data of the memory cells selected in memory cell array 1 to input/output buffer 10 in accordance with the high level signal from gate circuit 9g in internal write/read control circuit 9. Input /output buffer 10 transmits the data supplied from output register 13 to the data input/output terminals in accordance with the read instructing signal (i.e., output signal of gate circuit 9g) from internal write/read control circuit 9.

When flow through signal /FT is at the high level, output register 13 performs the latch operation in accordance with internal clock signal CLK. Specifically, it latches the data of the selected memory cells transmitted from memory cell array 1, and will supply the latched memory cell data to input/output buffer 10 in the next clock cycle 2. Thus, in the flow through mode, data Q0 of the memory cell designated by initial address AD0 is output at the clock cycle (clock cycle 1) immediately subsequent to the cycle (clock cycle 0) in which initial address AD0 is applied. In contrast, when the flow through signal /FT is at the high level indicating the pipeline mode, data Q0 of the memory cell designated by initial address AD0 is output after elapsing of wait cycle T2W of one clock cycle.

In the subsequent clock cycle 1, address status signal /ADSP is maintained at the high level, and burst advance signal /ADV is set to the low level. In this case, the output signal of gate circuit 3a included in internal control signal generating circuit 3 attains the high level in response to rising of clock signal CLK, and the address counter output from burst counter 7 changes. Thereby, the address signal changes in accordance with the sequence designated by the mode signal MODE, and data Q1 of the memory cell at the next address is output. Every time clock signal CLK rises, burst advance signal /ADV is set to the low level and address status signal /ADSP is set to the high level, whereby the addresses are successively designated under the control of burst counter 7, and data Q1–Q3 of the memory cells corresponding to these addresses are read at the respective clock cycles (i.e., clock cycles T2).

In the data write operation, data can be likewise written in the bust mode. In this case, both signals /ADSP and /S1 are set to the low level to set the initial address. At this time, the output signal of gate circuit 3a is set to the high level, the output signals of OR circuits 3m–3p attain the high level, and write registers 5a–5d store inactive write enable signal. Therefore, data writing is not performed in this cycle. In the next clock cycle, address status signal /ADSP is set to the high level, and signals /BW1–BW4, /MBW and /GW for controlling the data writing are set to the intended states, so that, in the following clock cycles, data can be successively written into four addresses starting from the first designated initial address (write data is latched with a delay of one clock cycle, as will be described later).

In the data write operation necessary ones of, write control signals /BW1–/BW4, /MBW and /GW are set to the active state. At this time, signal /ADSP is at the high level, and the output signal of NOR circuit 3a is at the low level. If global write enable signal /GW is at the low level, all the output signals of OR circuits 3m–3p are at the low level, and write registers 5a–5d take in and latch the active write enable signals at the high level in response to rising of clock signal CLK. All the output signals of AND circuits 9a–9d attain the high level, all write drivers 12a–12d are activated, and data of 32 bits (i.e., data of one word) supplied from input register 11 is written into the selected memory cells in memory cell array 1. The output signal of gate circuit 9g is at the low level because the output signal of OR circuit 9e is at the high level, output register 13 is inactive, and input/output buffer 10 is set to the data writing state. At this time, burst advance signal /ADV is set to the low level at the rising of clock signal CLK, as is done in the read operation, whereby addresses are successively designated under the control of burst mode counter 7, and data can be written into the memory cells corresponding to the internally designated addresses.

FIG. 3 is a timing chart showing the data write operation. As shown in FIG. 3, address AD0 taken in at write cycle 1 is stored in address register 4 in this cycle 1, and write data D (AD0) taken in at cycle 2 is stored in input register 11. When data write is designated in cycle 2, the data stored in input register 11 is written into the memory cells designated by the address stored in address register 4. Data D (AD1) supplied in clock cycle 3 is written into the memory cells at address AD1 which was taken in at clock cycle 2. When data read is designated in clock cycle 3, data Q (AD2) of the memory cells corresponding to address AD2 are read in the subsequent clock cycle 4 (in the case of pipeline output mode).

When flow through signal /FT is set to the high level and the data read is performed in the pipeline mode, access to the initial address requires a wait cycle T2W of one clock cycle. However, the access time with respect to clock signal CLK is determined by only the delay time of the output portion included in input/output buffer 10. Therefore, fast clock access (i.e., access relative to the clock) can be achieved. In the burst read cycle (T2), the wait cycle is not required. Therefore, data can be read fast. As compared with the case where flow through signal /FT is at the low level of active state and data read is performed in the flow through mode, data reading in this burst mode (pipeline mode) requires the wait cycle Taw, so that data transmission efficiency thereof is relatively low. However, such an advantage can be achieved that even a semiconductor memory device of a relatively low operation speed can achieve the fast clock access (for fast operation, an expensive BiCMOS process must be employed).

FIG. 4 is specifically shows a structure of the input circuit shown in FIG. 1. In FIG. 4, address status signals /ADSC and /ADSP are represented by one address status (strobe) signal /ADS. Likewise, write enable signals /BW1–/BW4, /MBM and /GW are represented by one write enable signal /WEN. The input circuits for signals MODE and /FT are not shown in FIG. 4. These signals are directly applied to burst counter and input/output register via the input circuit as shown in FIG. 1. Input circuits 2b and 2r for these signals MODE and /FT are supplied with internal snooze mode signal ZZ from input circuit 2c receiving external snooze mode signal /ZZ.

Input circuit 2c is formed of an inverter IV1 receiving snooze mode signal /ZZ externally supplied via an input terminal 30a. Input circuit 2e receives external clock signal CLK applied via an input terminal 30b and internal snooze mode signal ZZ from input circuit 2c, and produces the internal clock signal INT.CLK. An input circuit 20a receives address status signal /ADS via an input terminal 30c, and also receives internal snooze mode signal ZZ. An input circuit 20b receives write enable signal /WEN via an input terminal 30d, and also receives internal snooze mode signal ZZ. Input circuit 2a receives the address signal via an input terminal 30e, and also receives internal snooze mode signal ZZ. An input circuit 20c receives input data DQ(D) via an input terminal 30f, and also receives internal snooze mode signal ZZ. Input circuit 2g receives output enable signal /OE via an input terminal 30g, and also receives internal snooze mode signal ZZ.

Each of input circuits 2a, 2e, 2g and 20a–20c is formed of an NAND gate NR receiving internal snooze mode signal ZZ and the signal from the corresponding input terminal, and an inverter IV2 receiving the output signal of NAND gate NR.

The output signals of input circuits 2e, 20a, 20b, 20c and 2g are supplied to internal circuits 35a–35f, respectively. Internal circuits 35a–35f correspond to the input circuits included in the input/output buffer and the internal control signal generating circuit shown in FIG. 1. For example, internal circuit 35a corresponds to gate circuit 3a and write registers 5a–5d. Internal circuit 35b corresponds to NOR circuit 3j and gate circuits 3k and 3l in FIG. 1. Internal circuit 35c corresponds to, for example, OR circuits 3b–3e and AND circuits 3f–3i. Internal circuit 35d corresponds to address register 4. Internal circuit 35e corresponds to the input buffer included in input/output buffer 10 in FIG. 1. Internal circuit 35f corresponds to gate circuit 9f in internal write/read control circuit 9 shown in FIG. 1.

When the processing stops and it is determined that an external access to the semiconductor memory device is not necessary, the processor sets the external snooze mode signal /ZZ to the high level. When only holding of data in a DRAM (Dynamic Random Access Memory) which is a main storage is to be performed in a battery-powered personal computer for example, snooze mode signal /ZZ is set to the high level of active state. In this case, as shown in FIG. 5, external snooze mode signal (EXT.) /ZZ is supplied asynchronously to external clock signal EXT.CLK. Internal snooze mode signal (INT.)ZZ is set to the low level of active state after elapsing of a delay time of inverter IV1. When internal snooze mode signal (INT.)ZZ is set to the low level, output signals of input circuits 2e, 2a and 20c are fixed to the low level. Therefore, charging and discharging are not performed in input circuits 2e, 20a–20c, 2a and 2q, so that power consumption can be reduced. In this case, the internal signal at the low level of active state may be supplied to the internal circuits. Even in this case, each external control signal is latched by the register in response to rising of internal clock signal INT.CLK as shown in FIG. 1, so that internal operation of the semiconductor memory device is inhibited due to stop of generation of internal clock signal INT.CLK.

However, snooze mode signal /ZZ is supplied asynchronously to external clock signal EXT.CLK (CLK). Therefore, when external snooze mode signal (EXT.)ZZ is set to the high level at substantially same timing as rising timing of external clock signal (EXT.)CLK, for example, as shown in FIG. 6, the following problem arises.

Input circuit 2c is formed of inverter IV1, and has a delay time of, e.g., several nanoseconds. As shown in FIG. 6, therefore, when external snooze mode signal EXT./ZZ is set to the high level at the same timing as rising timing of external clock signal EXT.CLK, internal clock signal INT.ZZ attains the low level after elapsing of delay time Td of input circuit 2c. For example, in clock input circuit 2e, delay by Td therefore occurs in the timing of cutting off external clock signal EXT.CLK applied to input terminal 30b. Consequently, external clock signal EXT.CLK which is applied during delay time Td passes through input circuit 2e, and internal clock signal INT.CLK attains the high level for that period. Operation similar to the above is performed in the other input circuits. Therefore, when write enable signal /WEN is set to the low level in this state, the input register operates in accordance with internal clock signal INT.CLK, and internal chip select signal (INT.)CS attains the high level. Also, the address signal is latched by the register, and data is written into a memory cell in accordance with the erroneously latched address signal. This results in a problem that the memory cell data to be stored is destroyed.

In particular, if all the input circuits have the same common structure as shown in FIG. 4, the internal signals may be held at the active state during the snooze mode, which increases the possibility that malfunction, particularly, writing of erroneous data is performed due to internal clock signal INT.CLK generated in a spike-like form.

In the synchronous semiconductor memory device, the external signals are taken in at rising of internal clock signal INT.CLK, and its internal operation is determined depending on the states of taken signals. Therefore, if a similar problem occurs also at another input circuit, malfunction of a circuit may occur due to generation of an unexpected internal signal in this synchronous semiconductor memory device.

If external snooze mode signal EXT.ZZ is lowered at substantially the same timing as the rising timing of external clock signal EXT.CLK in order to terminate the snooze mode operation, this results in generation of internal clock signal INT.CLK, so that a similar problem arises.

In order to avoid the above problems, it is necessary to deactivate all the external control signals upon entering of the snooze mode. For example, upon entering of the snooze mode, it is necessary to deactivate signal /WEN and all chip select signals CS (S2, /S2, /S1) and set address status signal /ADS to the high level in order to prevent the setting of the data write state. Therefore, whenever the memory device enters or exits the snooze mode, an external processing unit must set the states of not only snooze mode signal EXT./ZZ but also other signals, resulting in a problem that a load to the external processing unit increases when entering the snooze mode.

SUMMARY OF THE INVENTION

An object of the invention is to provide a synchronous semiconductor memory device which can easily enter and exit the snooze mode without requiring complicated adjustment of timings of external signals.

Another object of the invention is provide a synchronous semiconductor memory device in which the snooze mode can be easily set and reset without malfunction.

According to a synchronous semiconductor memory device of the invention, when entering (or exiting) a snooze mode, a clock input circuit receiving an external clock signal is first disabled (or enabled) after elapsing of a predetermined time, and subsequently input circuits receiving other external signals are disabled (or enabled).

When entering the snooze mode, the internal clock signal is surely generated, so that internal operation is executed in accordance with combination of control signals at the time of switching over to the snooze mode. When exiting the snooze mode, the input circuit receiving the clock signal is first released from the snooze mode prior to the release of other input circuits. Therefore, during a period between first and subsequent releases, an internal control signal maintains the inactive state, so that internal operation can be surely inhibited even if the internal clock signal is produced, and thus erroneous data writing can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
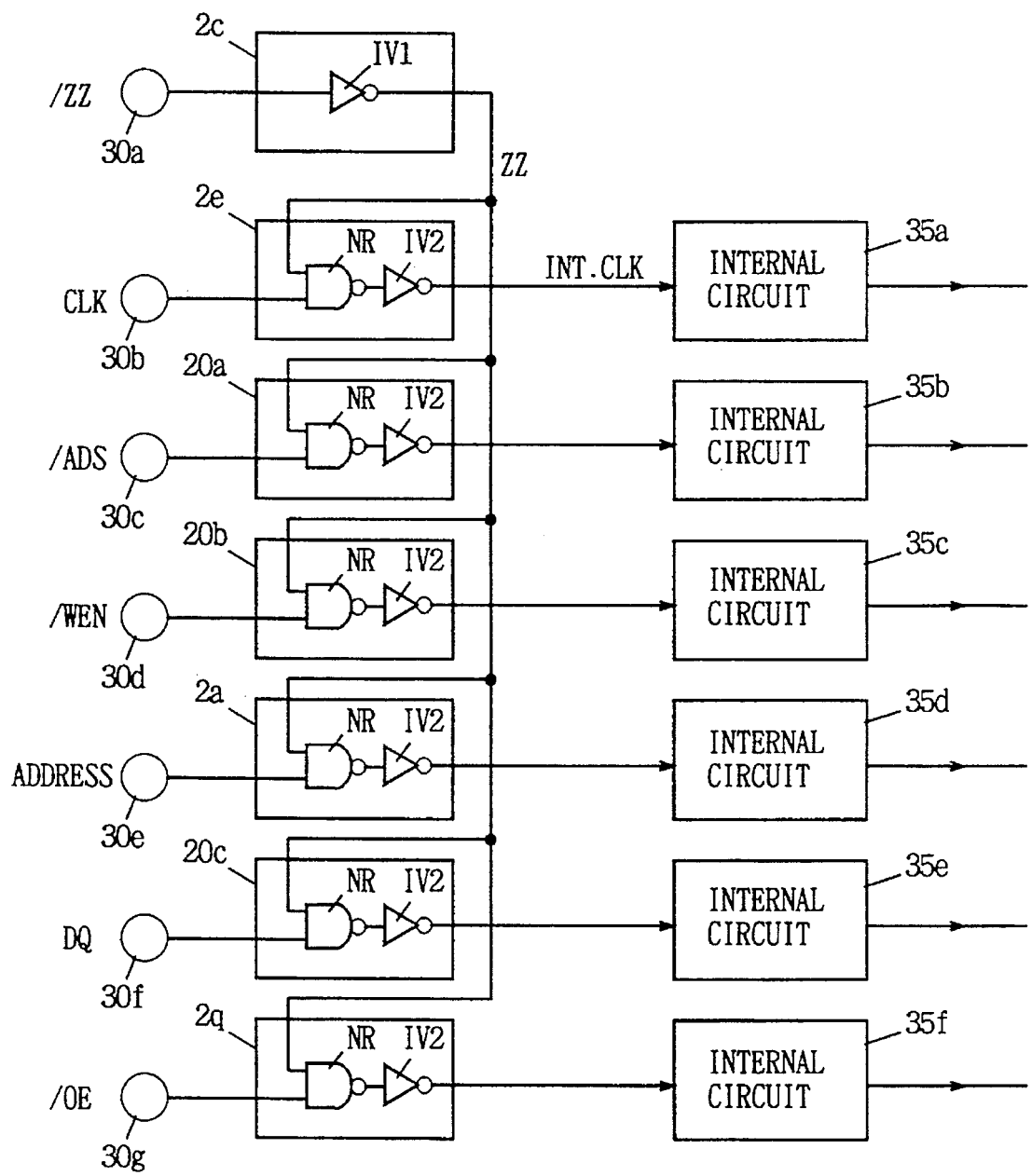
FIG. 4 schematically shows a structure of a signal input portion in the conventional synchronous semiconductor memory device.
Figure 5:
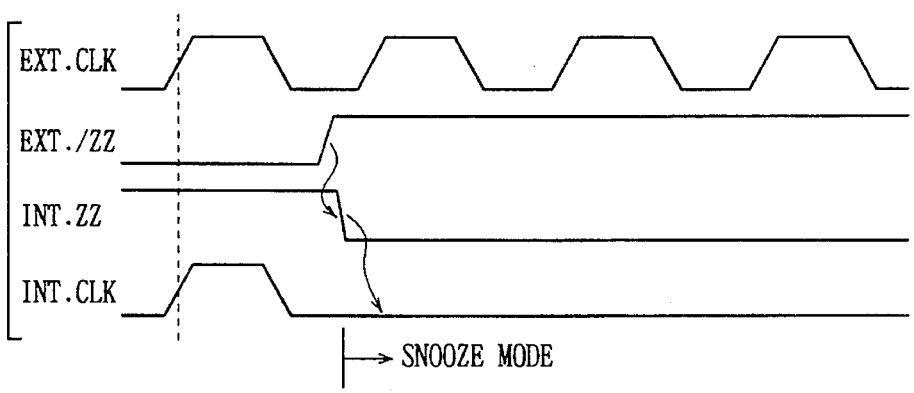
FIG. 5 is a waveform diagram showing operation of the conventional synchronous semiconductor memory device upon entering to a snooze mode.
Figure 6:
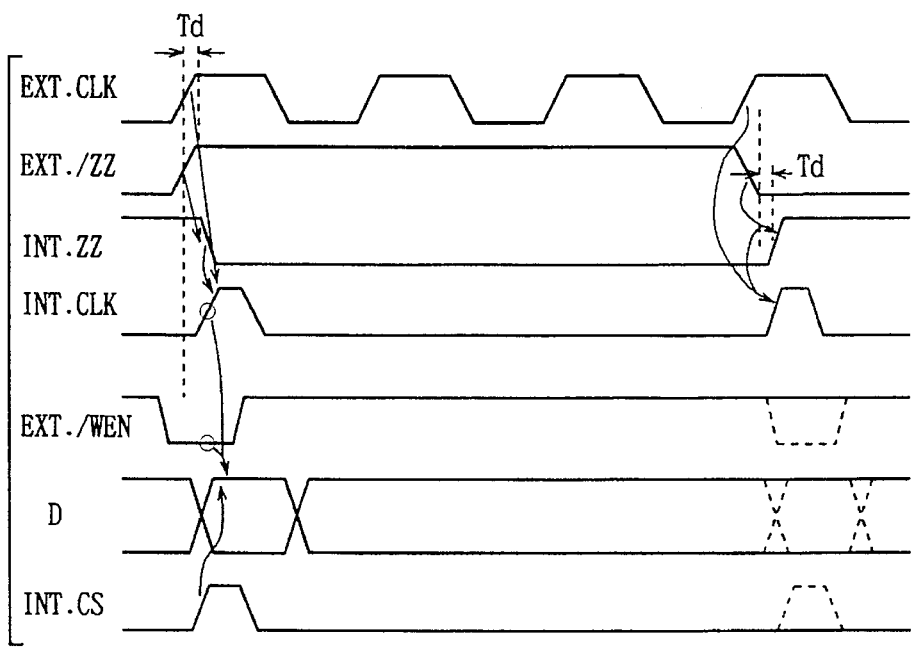
FIG. 6 is a diagram for explaining a problem of the conventional synchronous semiconductor memory device.
Figure 7:
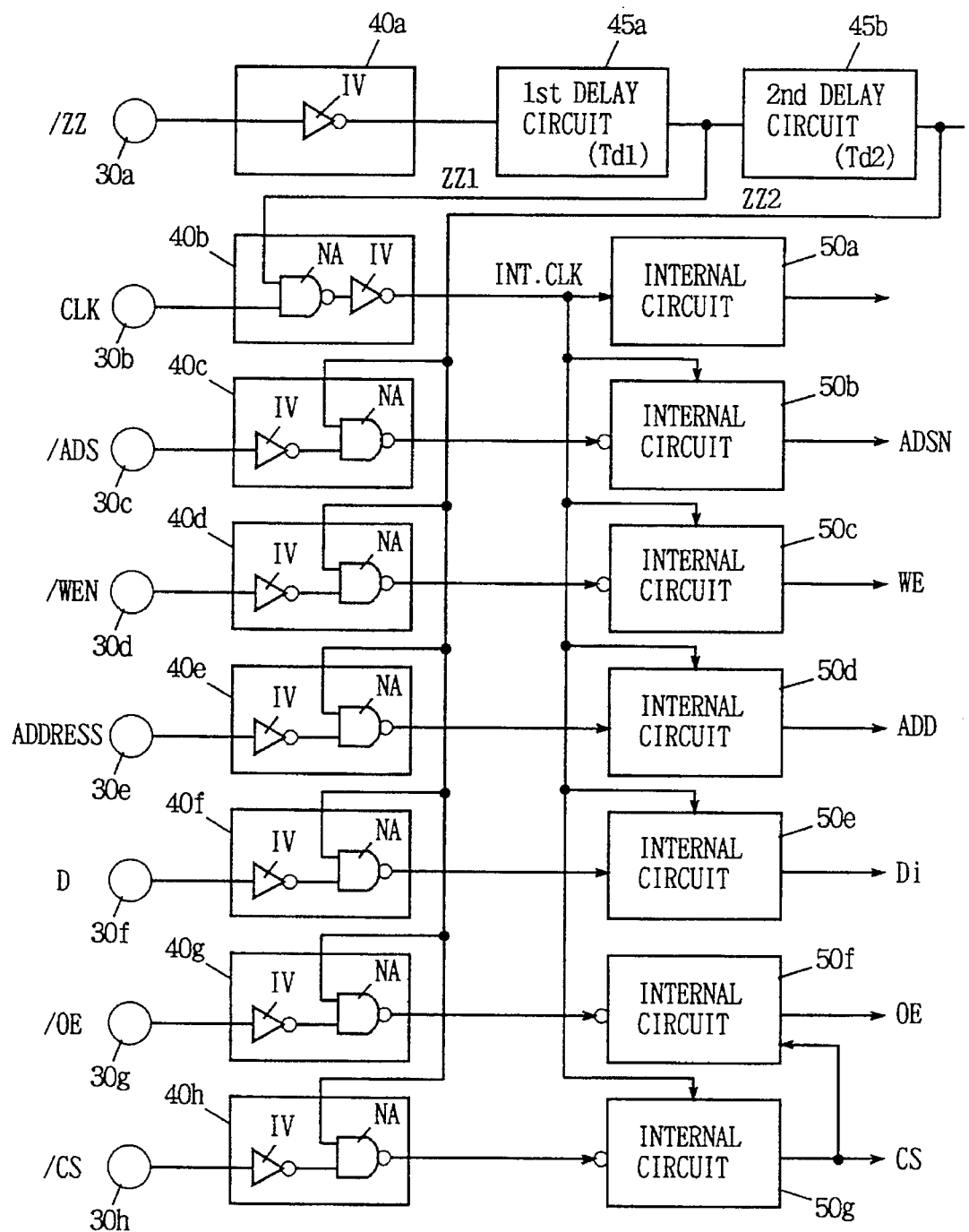
FIG. 7 shows a structure of a signal input portion of a synchronous semiconductor memory device according to an embodiment of the invention.

FIG. 7 schematically shows a structure of a signal input portion of a synchronous semiconductor memory device according to an embodiment of the invention. In FIG. 7, input circuits 40a–40h are provided corresponding to respective input terminals 30a–30h receiving external signals. Input circuits 40a and 40b correspond to the input circuits 2c and 2e shown in FIG. 4, respectively. More specifically, input circuit 40a is formed of an inverter receiving external snooze mode signal /ZZ via input terminal 30a. Input circuit 40b includes an NAND circuit NA receiving external clock signal CLK via input terminal 30b and an inverter IV inverting the output signal of NAND circuit NA. Input circuit 40c receives address status signal /ADS via input terminal 30c.

Input circuit 40d receives write enable signal /WEN via input terminal 30d. Address input circuit 40e receives address signal ADDRESS via input terminal 30e. Input circuit (input buffer) 40f receives write data D via input terminal 30f. Input circuit 40e receives output enable signal /OE via input terminal 30g. Input circuit 40h receives chip select signal /CS via input terminal 30h.

Input circuits 40c–40h have the same structure, and each include an inverter IV receiving an external signal through a corresponding terminal and 2-input NAND circuit NA receiving at one input the output signal of inverter IV.

The output signal of input circuit 40a receiving snooze mode signal /ZZ is supplied to cascaded first and second delay circuits 45a and 45b. A first internal snooze mode signal ZZ1 generated from first delay circuit 45a is supplied to the other input of NAND circuit NA in clock input circuit 40b. A second internal snooze mode signal ZZ2 generated from second delay circuit 45b is supplied to the other input of NAND circuit NA in each of input circuits 40c–40h.

Internal circuits 50a–50g are provided corresponding to respective input circuits 40b–40h. Internal circuit 50a receives an internal clock signal from clock input circuit 40b. Each of internal circuits 50b–50e and 50g operates in response to the internal clock signal from clock input circuit 40b, to take in the signal received from the corresponding input circuit and output an internal signal. Internal circuit 50b outputs an internal address status signal ADSN. Internal circuit 50c outputs an internal write enable signal WE. Internal circuit 50d outputs an internal address signal ADD. Internal circuit 50e outputs an internal write data Di, and internal circuit 50f outputs an internal output enable signal OE. Internal circuit 50g outputs an internal chip select signal CS.

Figure 1:
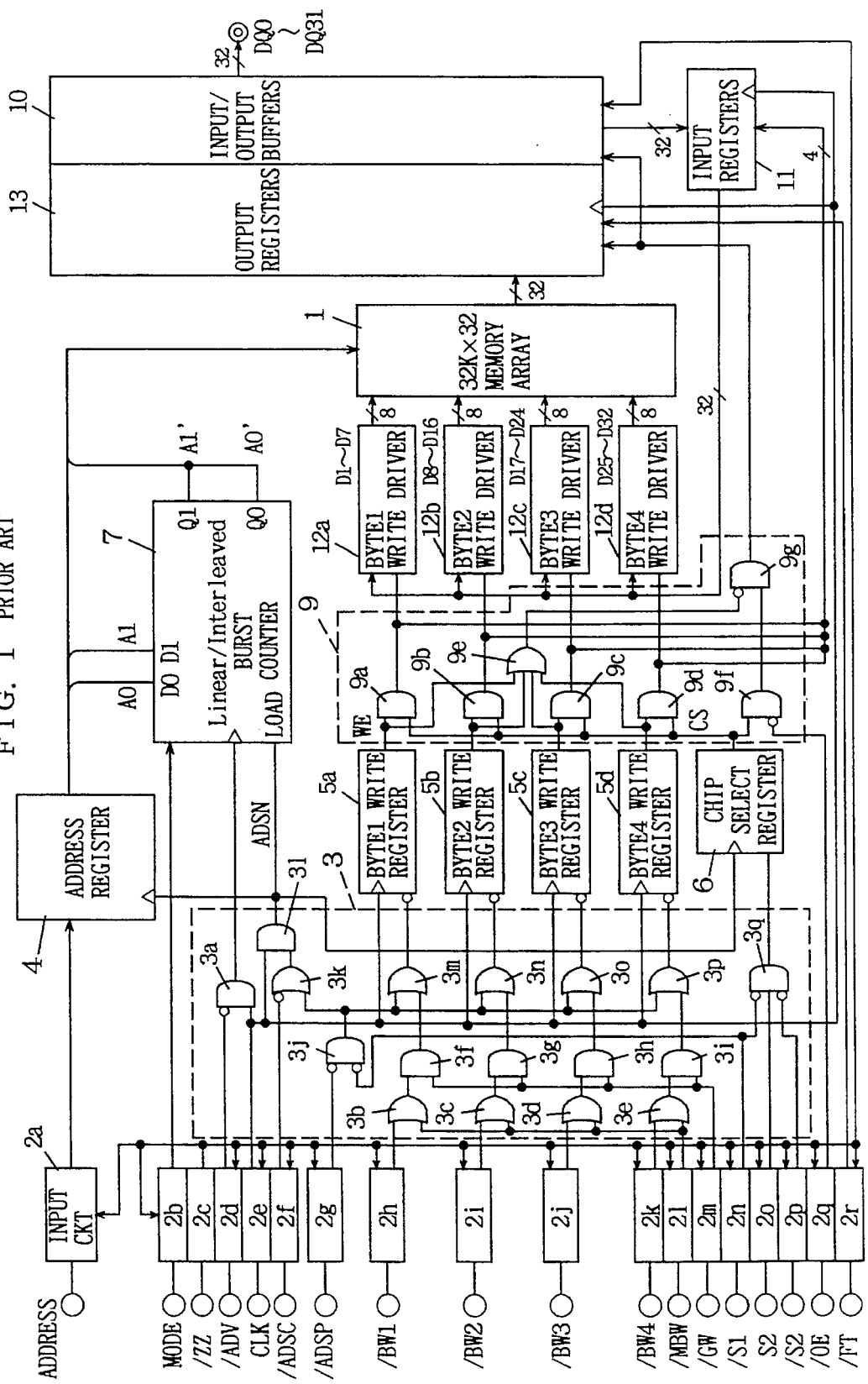
FIG. 1 is a block diagram schematically showing a whole structure of a conventional synchronous semiconductor memory device.
Figure 2:
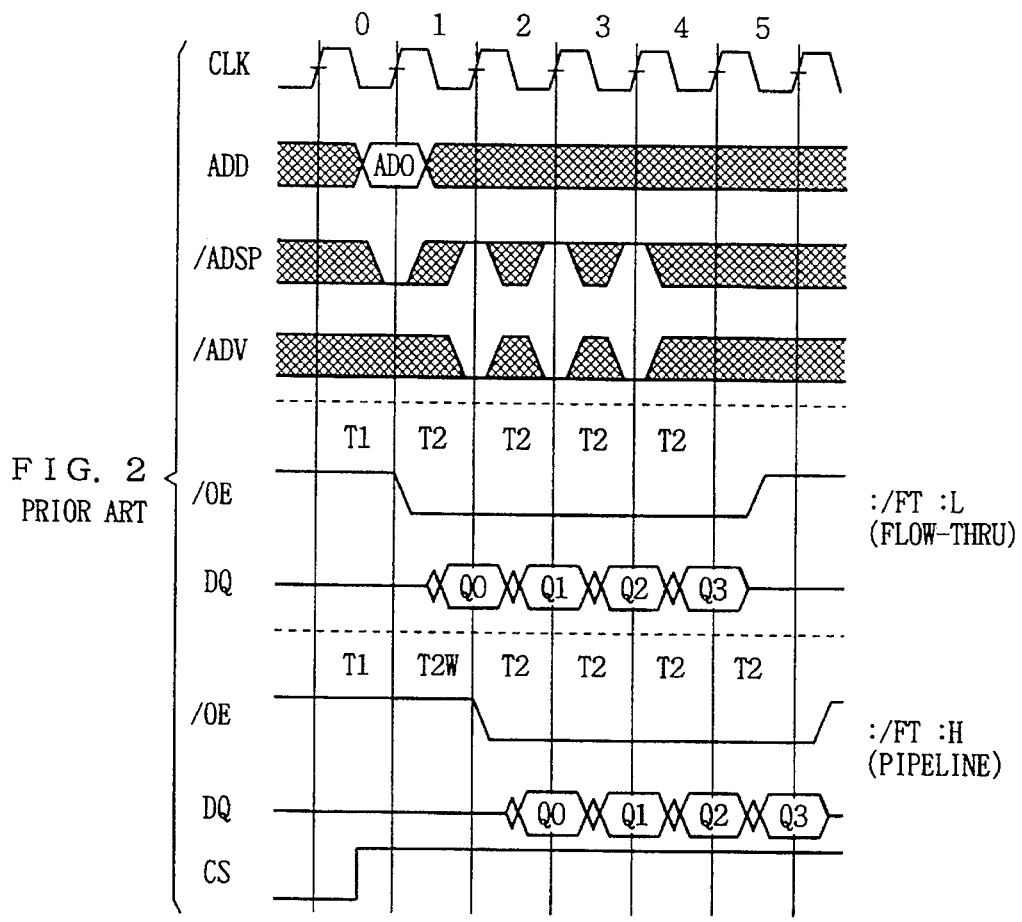
FIG. 2 is a timing chart showing data read operation of the conventional synchronous semiconductor memory device.
Figure 3:
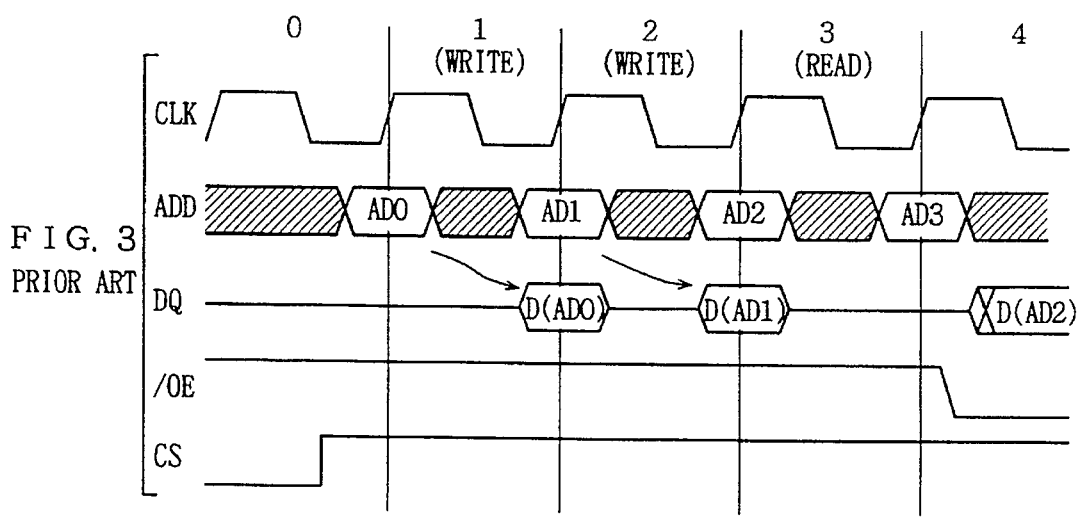
FIG. 3 is a timing chart showing data write operation of the conventional synchronous semiconductor memory device.

Internal circuit 50b corresponds to gate circuits 3a, 3k and 31 shown in FIG. 1. Internal circuit 50c includes write registers 5a–5d and the respective gate circuits provided in the input portion shown in FIG. 1. Internal circuit 50d includes address register 4 shown in FIG. 1. Internal circuit 50g corresponds to gate circuit 3q and chip select register 6 shown in FIG. 1. However, according to the structure shown in FIG. 1, internal circuit 50g should be responsive not to the internal clock signal but to address status signal ADSN from internal circuit 50b operating in synchronization with the internal clock signal INT.CLK. Internal circuit 50g outputting internal chip select signal CS is responsive to internal clock signal INT.CLKS, and thus internal circuit 50g operating only in synchronization with internal clock signal INT.CLK in FIG. 7. Internal circuit 50e corresponds to input register 11 in FIG. 1. Internal circuit 50f outputs internal output enable signal OE in response to chip select signal CS from internal circuit 50e, and corresponds to gates 9f and 9g shown in FIG. 1.

All internal circuits 40c–40h have the same structure. In FIG. 7, when internal snooze mode signal ZZ1 or ZZ2 designates the snooze mode, the output signal generated from each input circuit is set to the inactive state of high level. Input circuits 40b–40h may have another structure, in which case logic of signals is appropriately adjusted in internal circuits 50b–50g.

First delay circuit 45a has a delay time Td1 between ½ and 1 of cycle time of external clock signal CLK. For example, if one cycle time of clock signal CLK is 15 nsec, first delay circuit 45a provides a delay of 10 nsec. A delay time Td2 of second delay circuit 45b is set to a value between 2 and 5 nsec, if the cycle time of external clock signal CLK is 15 nsec. Delay time Td2 of second delay circuit 45b is set to a value slightly larger than a delay time Tdc of clock input circuit 40d. Now, operation will be described below.

Figures 8, 9:
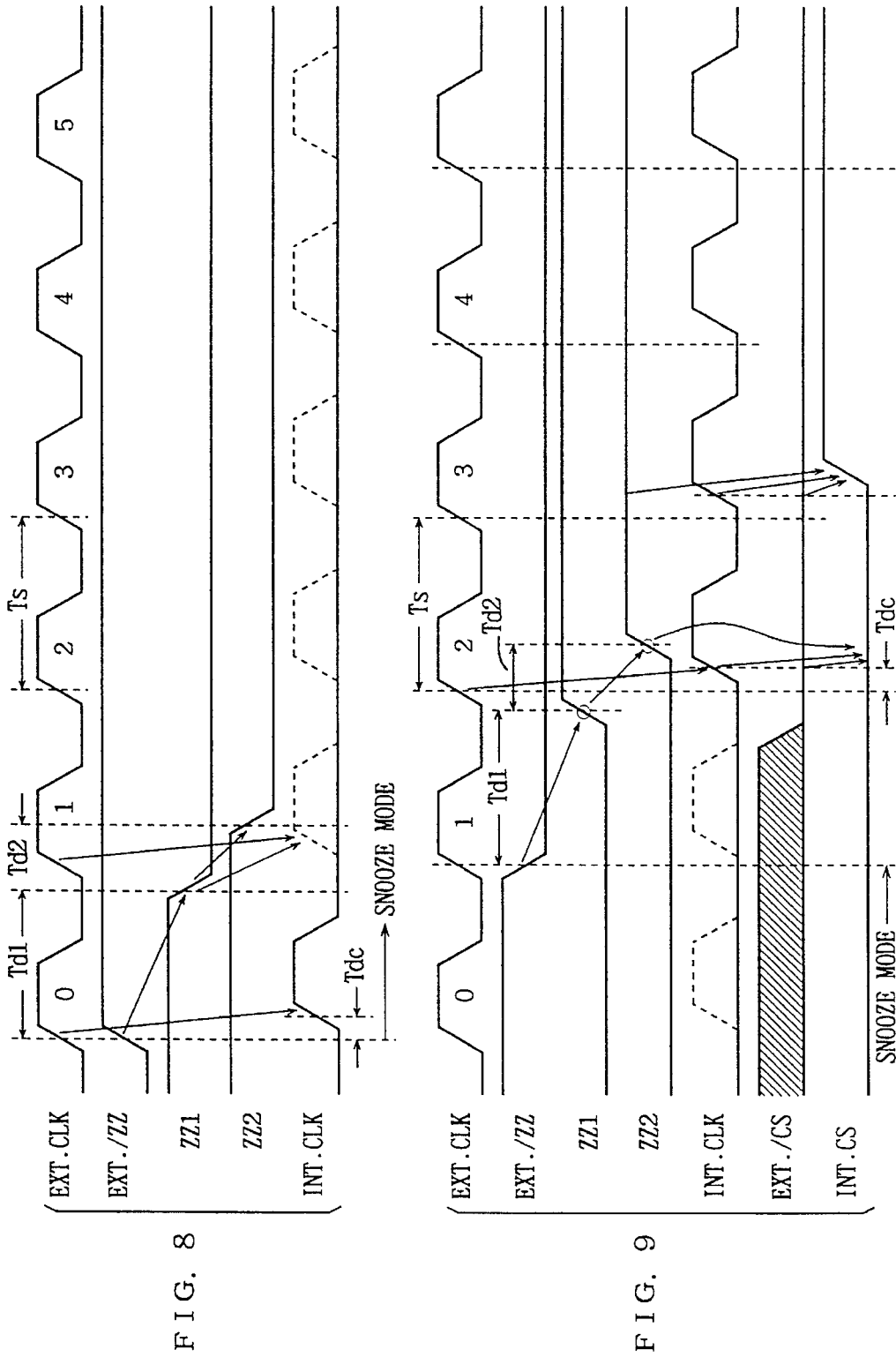
FIG. 8 is a waveform diagram showing an operation of the synchronous semiconductor memory device of the invention when entering a snooze mode.
FIG. 9 is a waveform diagram showing an operation of the synchronous semiconductor memory device of the invention when exiting the snooze mode.

Referring first to FIG. 8, the operation for entering the snooze mode will be described. When external snooze mode signal /ZZ supplied to input terminal 30a rises from the low level to the high level designating the snooze mode, first internal snooze mode signal ZZ1 outputted from first delay circuit 45a falls to the low level after elapsing of delay time Td1 of first delay circuit 45a. Delay time Td1 of first delay circuit 45a satisfies the relationship of (½)·Ts≦Td1≦Ts with respect to cycle time Ts of external clock signal CLK. Therefore, when external clock signal EXT.CLK (clock signal CLK supplied to input terminal 30b) and external snooze mode signal EXT.ZZ supplied to input terminal 30a rise at substantially the same timing as shown in FIG. 8, first internal snooze mode signal ZZ1 is still at the high level, and NAND circuit NA in clock input circuit 40b operates as an inverter and passes external clock signal EXT.CLK (CLK) supplied to input terminal 30b. After elapsing of delay time Tdc of clock input circuit 40b, internal clock signal INT.CLK rises to the high level. Since delay time Td1 has a length not smaller than ½ of the cycle time, internal clock signal INT.CLK is maintained at the high level for a period substantially equal to that of the high level of external clock signal EXT.CLK.

Even when internal clock signal INT.CLK rises to the high level, second snooze mode signal ZZ2 supplied from second delay circuit 45b still maintains the high level, and internal circuits 40c–40h pass the external signals received via corresponding input terminals 30b–30h. Therefore, in the cycle in which the snooze mode is designated, input circuits 50a–50g set the states of internal signals ADSN, WE, ADD, Di, OE and CS to the decided states. Therefore, in the cycle (cycle 0) in which the snooze mode is designated, an internal operation according to the external signals is performed. At this time, internal clock signal INT.CLK is not form of a spike-like pulse but has a sufficient time width. Therefore, input circuits 50a–50g reliably take in and latch the internal signals received from input circuits 40b–40h, so that the internal signals are accurately set to the levels corresponding to the externally supplied signal states, and thus the internal operation is executed accurately.

Before the next clock cycle (cycle 1) starts, first internal snooze mode signal ZZ1 generated from first delay circuit 45a falls to the low level, and the output signal of NAND circuit NA in clock input circuit 40b is fixed to the high level. Thus, internal clock signal INT.CLK is fixed to the low level. Therefore, in the subsequent cycles (i.e., the cycle 1 et seq.), internal clock signal INT.CLK maintains the low level, so that input circuits 50a–50g do not latch the signal. In other words, they are set to the through state in which the registers in respective input circuits 50a–50g pass the received signals. At this time, second snooze mode signal ZZ2 generated from second delay circuit 45b falls to the low level, and all the output signals of input circuits 40c–40h are fixed to the inactive state (high level in FIG. 7). Therefore, all the internal signals output from internal circuits 50b–50g are maintained at the inactive state (it is required that at least internal chip select signal /CS is inactive), and the internal circuit operation is surely inhibited.

As described above, first delay circuit 45a operates to lower internal snooze mode signal EXT./ZZ with a delay between ½ and 1 multiple of cycle time Ts of clock signal CLK and to disable clock input circuit 40b for deactivating its output signal INT.CLK regardless of the state of the external signal EXT.CLK. Therefore, in the cycle in which the snooze mode is designated, internal clock signal INT.CLK is generated, and internal operation is executed accurately in accordance with the external signals. In the next clock cycle, internal clock signal INT.CLK is deactivated (fixed to the low level), and any internal operation is inhibited. At this time, second snooze mode signal ZZ2 deactivates all the internal signals, so that all the internal signals from the internal circuits can be maintained at the inactive state, and the internal circuits can be surely maintained disabled, which prevents malfunction of any circuits.

Referring to FIG. 9, description will be given on the operation before release from the snooze mode. In clock cycle (cycle 0), external snooze mode signal EXT./ZZ is changed from the high level to the low level, and it is designated that the snooze mode is released. In clock cycle 0, generation of internal clock signal CLK is inhibited (clock input circuit 40b is in the disable state). In this state, second snooze mode signal ZZ2 maintains input circuit 40h at the disable state regardless of the state of external chip select signal /CS applied to input terminal 30h, and the output signal of input circuit 40h is at the high level of inactive state. In this state, therefore, internal chip select signal INT.CS(CS) outputted from input circuit 50g maintains the inactive state of low level.

Substantially in synchronization with rising of external clock signal EXT.CLK at a clock cycle 1, external snooze mode signal EXT./ZZ is set to the low level to designate the release from the snooze mode. At this time, first internal snooze mode signal ZZ1 generated from first delay circuit 45a rises to the high level after elapsing of delay time Td1. Therefore, in this clock cycle 1, clock input circuit 40b maintains the disable state, and internal clock signal INT.CLK maintains the low level. Also in this state, therefore, internal chip select signal CS output from internal circuit 50g maintains the inactive state of low level. In this clock cycle 1, external chip select signal EXT. /CS is set to the low level.

In clock cycle 2, first snooze mode signal ZZ1 generated from first delay circuit 45a is already raised to the high level, and clock input circuit 40b is enabled to pass externally applied clock signal CLK. In clock cycle 2, therefore, internal clock signal INT.CLK rises to the high level when delay time Tdc of clock input circuit 40b elapses after rising of external clock signal EXT.CLK. In this state, however, even when internal clock signal INT.CLK rises to the high level, second snooze mode signal ZZ2 outputted from second delay circuit 45b still maintains the low level, and input circuit 40h maintains the disable state. Therefore, the output signal of input circuit 40h is at the high level of inactive state, and internal chip select signal INT.CS(CS) outputted from internal circuit 50g maintains the low level. In this clock cycle 2, therefore, no internal operation is performed. (As shown in FIG. 1, internal chip select signal CS outputted from chip select register 6 controls operation of the write driver, and thus erroneous data writing is prevent.)

In clock cycle 2, second snooze mode signal ZZ2 generated from second delay circuit 45b rises to the high level, and input circuits 40c and 40h are enabled to produce the internal signals corresponding to the externally applied signals.

In clock cycle 3, when external clock signal EXT.CLK rises to the high level, and internal clock signal INT.CLK rises to the high level, internal circuit 50g takes in the internal signal received from input circuit 40h and outputs the internal chip select signal INT.CS set to the high level after elapsing of a predetermined delay time. Therefore, internal operation corresponding to the external signals starts in this clock cycle 3.

Figure 10:
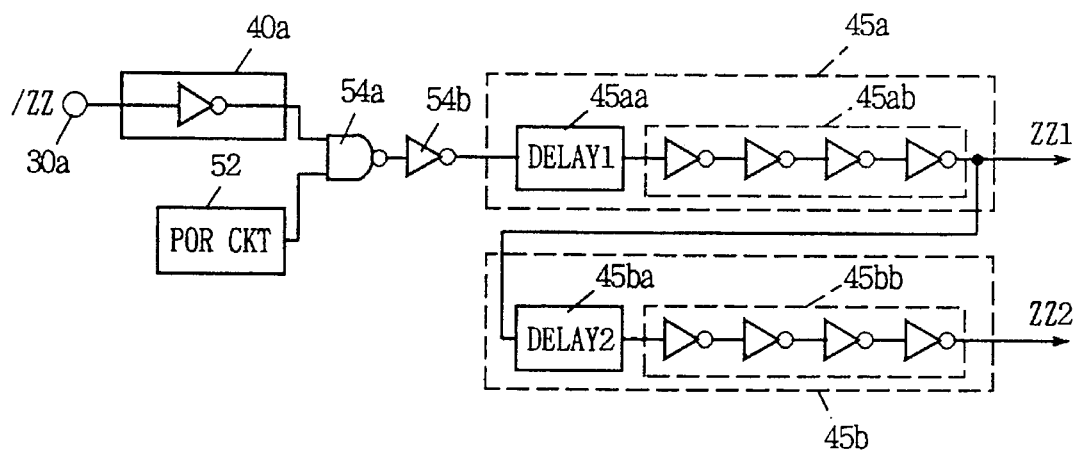
FIG. 10 shows a specific structure of a snooze mode signal input portion shown in FIG. 7.

FIG. 10 specifically shows a structure of the internal snooze mode signal generating portion. In FIG. 10, the output signal of input circuit 40a which receives snooze mode signal /ZZ applied to input terminal 30a is supplied to an NAND gate 54a together with an output signal of a POR circuit 52. POR circuit 52 outputs an active signal at the high level when an internal power supply voltage attains a predetermined voltage level and is stabilized after power-on of the memory device. This prevents an operation of the inner circuits of the memory device when the internal power supply voltage is unstable. The output signal of POR circuit 52 is also supplied to each of input circuits 40b–40h shown in FIG. 7, though not explicitly shown. The output signal of NAND circuit 54a is supplied to first delay circuit 45a via an inverter 54b. First delay circuit 45a includes a first delay element 45aa having a large delay time and a buffer 45ab which performs buffer processing on the output signal of first delay element 45aa and is formed of even stages of (four in FIG. 10) cascaded inverters. Buffer 45ab outputs first internal snooze mode signal ZZ1. The delay time of buffer 45ab is sufficiently smaller than the delay time provided by first delay element 45aa.

Second delay circuit 45b includes a delay element 45ba receiving first internal snooze mode signal ZZ1 and a buffer 45bb which performs buffer processing on the output signal of second delay element 45ba and is formed of even stages of (four in FIG. 10) cascaded inverters. The delay time of buffer 45bb is sufficiently smaller than the delay time of second delay element 45ba.

Figure 11:
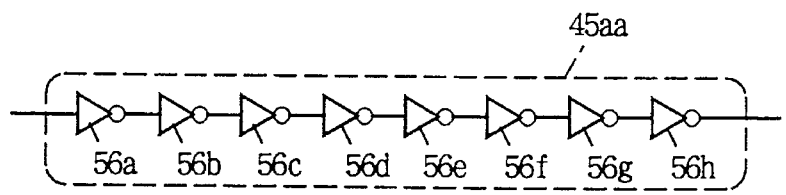
FIG. 11 shows a specific structure of a first delay circuit shown in FIG. 10.

FIG. 11 shows a specific structure of first delay element 45aa shown in FIG. 10. In FIG. 11, first delay element 45aa includes even stages of (eight in FIG. 11) cascaded CMOS inverters 56a–56h.

Each of CMOS inverters 56a–56h is formed of one p-channel MOS transistor and one n-channel MOS transistor. The delay time of the CMOS inverter can be estimated relatively accurately even if it is affected by variation in the operation temperature and deviation in the manufacturing parameters, and hence the required delay time can be acquired easily and relatively accurately. Second delay element 45ba is likewise formed of CMOS inverters, which are smaller in number than those of first delay elements 45aa.

Figure 12:
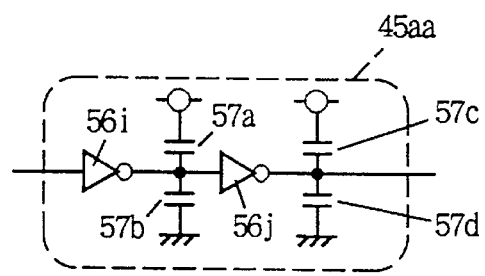
FIG. 12 shows a specific structure of a second delay circuit shown in FIG. 10.

FIG. 12 shows a first modification of first delay element 45aa shown in FIG. 10. In FIG. 12, first delay element 45aa includes an inverter 56i, capacitors 57a and 57b delaying the output signal of inverter 56i by a predetermined time, an inverter 56j receiving the output signal of inverter 56i which is delayed by capacitors 57a and 57b, and capacitors 57c and 57d delaying the output signal of inverter 56a by a predetermined time.

Capacitor 57a is connected between a power supply node and the output of inverter 56i. Capacitor 57b is connected between the output of inverter 56i and a ground node. Capacitor 57c is connected between the power supply node and the output node of inverter 56j. Capacitor 57d is connected between the output node of inverter 56j and the ground node. Two capacitors connected in series between the power supply node and the ground node can equivalently achieve a capacitor which occupies a small area but has a large capacitance. Each of capacitors 57a–57d may have a structure of a parallel electrode type, which is made of polycrystalline silicon or metal such as aluminum. Alternatively, it may be formed of an MOS capacitor utilizing an active region formed at a surface of a semiconductor substrate. It may also use a junction capacitance formed between the semiconductor substrate and a well formed at the surface of the semiconductor substrate. It is possible to implement a capacitor occupying a small area but having a large capacitance, and thus it is possible to implement a delay element having a large delay time without increasing a circuit scale. Delay element 45ba has the same structure as that shown in FIG. 12. However, capacitors 57a–57d of the delay element 45ba have a small capacitance.

Figure 13:
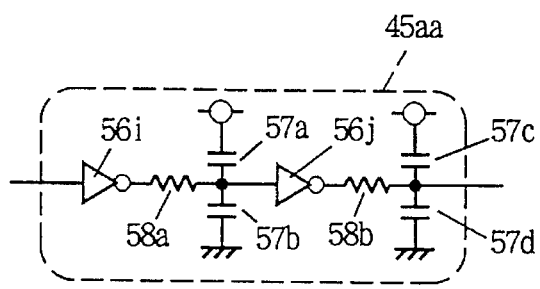
FIG. 13 shows another specific structure of the second delay circuit shown in FIG. 10.

FIG. 13 shows a second modification of a structure of first delay element 45aa shown in FIG. 10. The structure shown in FIG. 13 additionally includes at the output portions of inverters 56i and 56j with resistance elements 58a and 58b. Due to RC delay by the resistances and capacitors, a further long delay time can be implemented. Inverters 56i and 56j may be formed of conventional CMOS inverters.

Figure 14A:
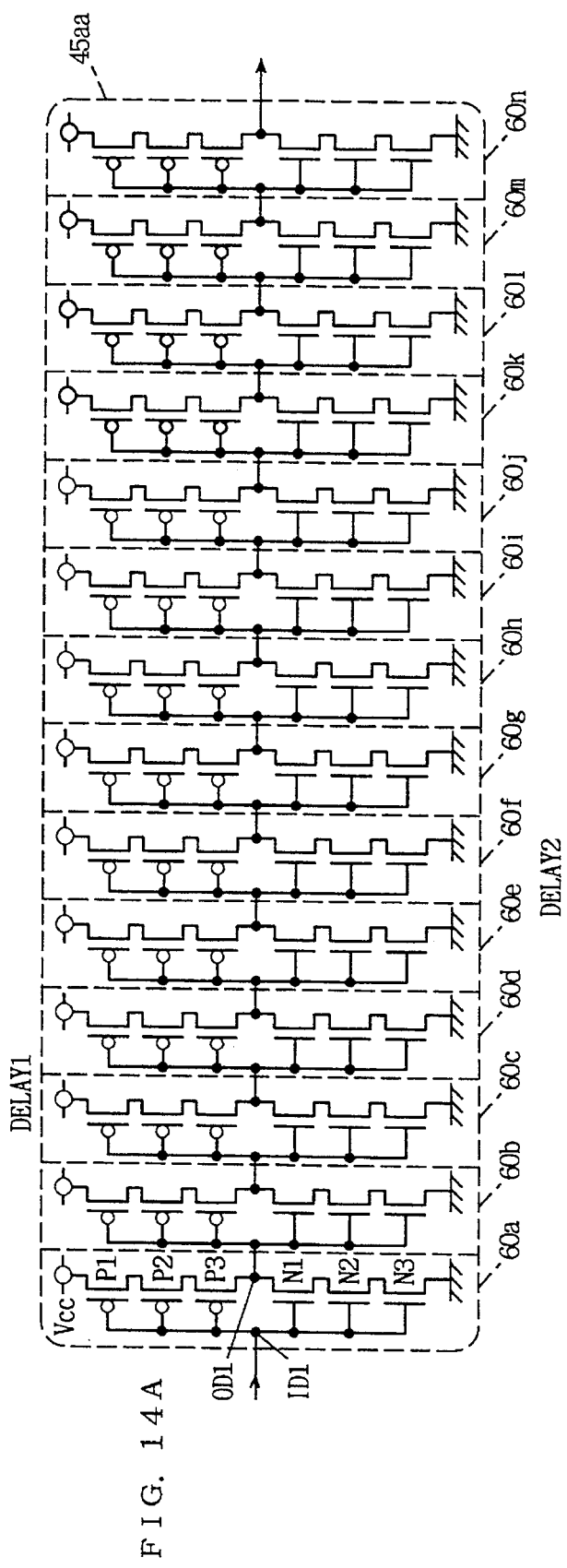
FIG. 14A shows another specific structure of the first delay circuit shown in FIG. 10.

FIG. 14A, shows a modification of a structure of the first delay element shown in FIG. 10. In FIG. 14A, first delay element 45aa includes even stages of (14 in FIG. 14A) cascaded gate circuits 60a–60n. Gate circuits 60a–60n have the same structure, and each includes a plurality of (three) p-channel MOS transistors p1–p3 connected in series between the power supply node (Vcc) and an output node OD1, and also includes a plurality of (three) n-channel MOS transistors n1–n3 connected in series between output node OD1 and the ground node. Gates of MOS transistors p1–p3 and n1–n3 are commonly connected to an input node ID1. Each of gate circuits 60a–60n functions as an inverter. Since the gates of a plurality of MOS transistors are connected to input node ID1, the gate capacitances of these transistors in combination increase the capacitance of the input node. Since the MOS transistors P1–P3 are connected in series between the power supply node and output node OD1, a resistance between the power supply node and output node OD1 increases, so that a capability of supplying a current to output node OD1 decreases, resulting in slow rising of its potential. Similarly, the channel resistances of MOS transistors n1–n3 connected in series between output node OD1 and the ground node reduce a speed of discharging output node OD1, resulting in slow falling of the potential of output node OD1. Therefore, each of gate circuits 60a–60n functions as a delay element owing to its large input gate capacitance and small current driving capability. As compared to a case of using a simple CMOS inverter formed of one p-channel MOS transistor and one n-channel MOS transistor, the number of gates connected in tandem can be reduced (provided that the transistors used therein have the same size), and an area occupied by the delay elements can be reduced.

Figure 14B:
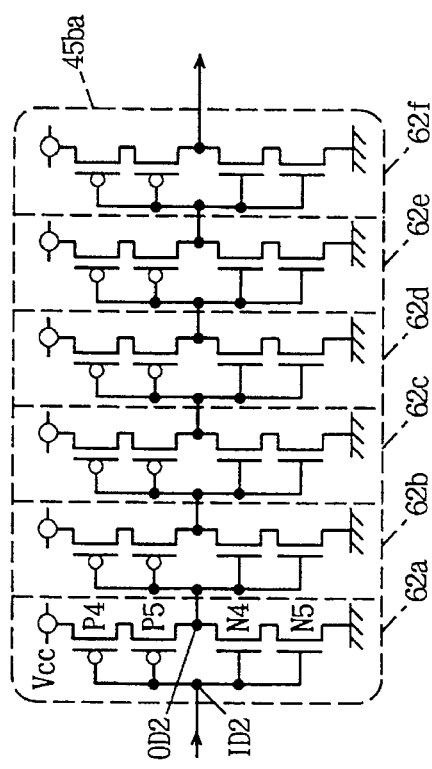
FIG. 14B shows a still another specific structure of the second delay circuit shown in FIG. 10.

FIG. 14B shows a specific structure of second delay element 45ba shown in FIG. 10. In FIG. 14B, second delay element 45ba includes even stages of cascaded (six) gate circuits 62a–62f. Gate circuits 62a–62f have the same structure, and each includes two p-channel MOS transistors p4 and p5 connected in series between the power supply node (Vcc) and an output node OD2, and also includes two n-channel MOS transistors n4 and n5 connected in series between output node OD2 and the ground node. Gates of MOS transistors p4, p5, n4 and n5 are commonly connected to an input node ID2. In each of gate circuits 62a–62f, the gate capacitance connected to the input node is large, and the MOS transistors connected in series reduce the current driving capability. As compared to each of gate circuits 60a–60n included in first delay element 45aa, gate circuits 62a–62f included in second delay element 45ba are smaller in number, and the MOS transistors included in each of gate circuits 62a–62f are smaller in number. Therefore, second delay element 45ba implement a delay time smaller than that by first delay element 45aa.

In delay elements 45aa and 45ba shown in FIGS. 14A and 14B, the number of gate circuits and the number of MOS transistors included therein can be appropriately selected in accordance with the delay times to be implemented. In this embodiment, if the cycle time of external clock signal CLK is 15 nsec, first delay element 45aa has the delay time of about 10 nsec, and second delay element 45ba has the delay time within 2 to 5 nsec.

Description has been given on the embodiment in which the synchronous semiconductor memory device is the synchronous SRAM allowing the burst mode operation. However, the invention can be applied to another semiconductor memory device which operates in synchronization with the external clock signal. The input circuit functioning as a buffer connected to an input terminal may be a circuit other than the circuit receiving the signal at the CMOS level, and specifically may be a circuit receiving a signal of a small amplitude, e.g., at a TTL or ECL level.

According to the invention, as described above, when the snooze mode is entered, the external clock signal can be surely taken in at the clock cycle in which the snooze mode is designated, so that it is possible to prevent malfunction which may be caused by an internal signal and a clock signal formed of a short pulse. When the snooze mode is reset, the internal clock is generated in the cycles following the cycle in which the snooze mode is designated, and the internal circuits are enabled after the internal clock is generated, so that it is possible to stop the operation of the internal circuits in the cycle in which the internal clock signal is first generated, and hence it is possible to prevent erroneous data writing and destruction of storage data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device taking in an external signal in synchronization with an externally applied clock signal, comprising:

a mode signal input circuit for receiving and delaying an externally applied specific operation mode designating signal by first and second delay times to produce first and second internal mode designating signals, respectively;

a clock input circuit for receiving said external clock signal to produce an internal clock signal, said clock input circuit including a first gate for inhibiting-generation of said internal clock signal in response to said first internal mode designating signal being active; and a signal input circuit for receiving said external signal and producing an internal signal, said signal input circuit including a second gate for inhibiting generation of said internal signal in response to said second internal mode designating signal being active.

2. The synchronous semiconductor memory device according to claim 1, wherein said clock input circuit and said signal input circuit each have inputs connected to corresponding input terminals.

3. The synchronous semiconductor memory device according to claim 1, further comprising:

an internal circuit for performing a predetermined processing in accordance with the internal signal received from said signal input circuit and responsive to said internal clock signal to take in the received internal signal and hold an output signal indicative of a result of said processing.

4. The synchronous semiconductor memory device according to claim 1, wherein said internal circuit produces an internal chip select signal controlling enabling and disabling of writing and reading of data of said semiconductor memory device.

5. The synchronous semiconductor memory device according to claim 1, wherein said first delay time is in a range from ½ to 1 of a time period of one cycle of said external clock signal.

6. The synchronous semiconductor memory device according to claim 1, wherein said mode signal input circuit includes:

a buffer coupled to a mode signal input terminal and receiving said specific operation mode designating signal applied to said mode signal input terminal;

a first delay circuit receiving and delaying by said first delay time an output signal of said buffer to output said first internal mode designating signal; and a second delay circuit delaying an output signal of said first delay circuit by a third delay time to produce said second internal mode designating signal, said second delay time being the sum of said first and third delay times.

7. The synchronous semiconductor memory device according to claim 1, wherein said mode signal input circuit includes a plurality of cascaded gate circuits, each gate circuit includes an output node and an input node, and also includes a plurality of p-channel MOS transistors connected in series between a power supply node and said output node and a plurality of n-channel MOS transistors connected in series between said output node and a ground node, and control gates of said plurality of p-channel MOS transistors and said plurality of n-channel MOS transistors gate circuits are connected commonly to said input node.

8. The synchronous semiconductor memory device according to claim 6, wherein said first delay circuit includes a plurality of cascaded first gate circuits, each cascaded first gate circuit including a first input node, a first output node, a plurality of first p-channel MOS transistors connected in series between a power supply node and said first output node and a plurality of first n-channel MOS transistors connected between said first output node and a ground node, control gates of said plurality of first p- and n-channel MOS transistors being connected commonly to said first input node; and said second delay circuit includes a plurality of cascaded second gate circuits and being smaller in number than said first gate circuits, each second gate circuit including a second input node, a second output node, a plurality of second p-channel MOS transistors connected in series between a power supply node and said second output node, and a plurality of second n-channel MOS transistors connected in series between said second output node and a ground node, control gates of said plurality of second p- and n-channel MOS transistors being connected commonly to said second input node.

9. The synchronous semiconductor memory device according to claim 6, wherein said third delay time is longer than a delay time provided by said clock input circuit.

10. The synchronous semiconductor memory device according to claim 1, wherein said signal input circuit includes means for deactivating the internal signal in response to said second internal mode designating signal being active.

\* \* \* \* \*